(12) United States Patent
Tornare (10) Patent No.: US 9,643,551 B2
(45) Date of Patent: May 9, 2017

(54) DEVICE FOR KEEPING A COMPUTER OF A MOTOR VEHICLE COMPRISING A MICROPROCESSOR IN A STANDBY MODE AND SWITCHING TO AN ACTIVE MODE

(71) Applicants: CONTINENTAL AUTOMOTIVE FRANCE, Toulouse (FR); CONTINENTAL AUTOMOTIVE GMBH, Hannover (DE)

(72) Inventor: Jean-Marc Tornare, Colomiers (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 0 days.

(21) Appl. No.: 14/429,187

(22) PCT Filed: Aug. 29, 2013

(86) PCT No.: PCT/EP2013/002601
§ 371 (c)(1),
(2) Date: Mar. 18, 2015

(87) PCT Pub. No.: WO2014/044354
PCT Pub. Date: Mar. 27, 2014

(65) Prior Publication Data
US 2015/0232047 A1  Aug. 20, 2015

(30) Foreign Application Priority Data
Sep. 21, 2012 (FR) .................................. 12 58893

(51) Int. Cl.
*B60R 16/03* (2006.01)

(52) U.S. Cl.
CPC .................................. *B60R 16/03* (2013.01)

(58) Field of Classification Search
None
See application file for complete search history.

(56) References Cited

U.S. PATENT DOCUMENTS 5,086,235 A * 2/1992 Marquet ................. H02J 9/061
307/64
5,239,520 A * 8/1993 Arnold .................... G06F 1/325
307/10.1

(Continued)

FOREIGN PATENT DOCUMENTS

CN  102369643  3/2012
EP  0 744 322 A2  11/1996

OTHER PUBLICATIONS

International Search Report, dated Nov. 7, 2013, from corresponding PCT application.

Primary Examiner — Truc M Do
Assistant Examiner — Jess Whittington
(74) Attorney, Agent, or Firm — Young & Thompson (57) ABSTRACT

A device for keeping a computer of a motor vehicle in a standby mode and for switching over to an active mode, with at least one electrical switch connected so that a change of an initial state of the switch constitutes an event that triggers the switching of the computer, and an electrical circuit incorporating each electrical switch, and an electrical power supply designed to exhibit two states: a power supply conducting steady state of each electrical switch wherein no power is consumed, obtained in the absence of a signal on its control input or upon the reception of a control signal of logic level "0", and a blocked state wherein power is consumed, obtained in the presence of a control signal of logic level "1" on its control input.

10 Claims, 5 Drawing Sheets

(56) References Cited

U.S. PATENT DOCUMENTS

| | | | | |
|---|---|---|---|---|
| 5,428,790 | A | * | 6/1995 | Harper .................. G06F 1/3203 713/322 |
| 5,621,250 | A | * | 4/1997 | Kim ......................... B60L 1/00 307/10.1 |
| 5,717,386 | A | | 2/1998 | Sakagami et al. |
| 5,794,055 | A | * | 8/1998 | Langer ................... H02J 9/005 713/300 |
| 6,393,571 | B1 | * | 5/2002 | Huckfeldt ................ G06F 1/32 713/300 |
| 6,437,460 | B1 | * | 8/2002 | Theofanopoulos . B60L 11/1809 307/10.1 |
| 6,738,914 | B2 | * | 5/2004 | Christopher .......... G06F 1/3203 713/300 |
| 7,263,416 | B2 | * | 8/2007 | Sakurai ................ F02D 41/062 307/9.1 |
| 2009/0235107 | A1 | * | 9/2009 | Gelonese ............. G06F 1/3203 713/340 |
| 2012/0022708 | A1 | * | 1/2012 | Higuchi ................ H02J 7/0031 700/293 |
| 2012/0182004 | A1 | * | 7/2012 | Higuchi ................ H02M 3/156 323/284 |

* cited by examiner

DEVICE FOR KEEPING A COMPUTER OF A MOTOR VEHICLE COMPRISING A MICROPROCESSOR IN A STANDBY MODE AND SWITCHING TO AN ACTIVE MODE

The invention relates to a device for keeping a computer of a motor vehicle comprising a microprocessor in a standby mode, called transport mode, and for switching over to an active mode, called customer mode.

BACKGROUND OF THE INVENTION

Between the date when a new vehicle leaves an assembly line and the date that that vehicle is taken over by its purchaser, many weeks often elapse, required for the transportation of said vehicle between its place of production and the final dealer.

During this period, the electrical consumption of the vehicle has to be as low as possible in order to avoid a discharging of the battery and, for this reason, each vehicle is initially configured in a mode, called transport mode, in which all the usual functions of the "car interior" computer are deactivated, apart from a function, performed by the microprocessor of this computer, of monitoring the state of an electrical switch connected in such a way that a change of state of said electrical switch constitutes an event triggering a switchover of said computer between its transport mode and the customer mode in which all its functions are reestablished. As an example, the electrical switches used can be the switches inserted into the handles of the vehicles in order to control the unlocking of the doors, the switch actuated by the vehicle ignition key, etc.

Such a transport mode therefore requires only the microprocessor to be powered in order for the latter to periodically monitor the state of each electrical switch concerned, and, in practice, the electrical consumption inherent in this transport mode is in the order of 400 microamperes-hour to a few milliamperes-hour.

Such an electrical consumption proves sufficiently low to serve as a guarantee, in most cases, against a total discharge of the batteries of the vehicles.

However, it has been found that, given the maximum transportation times added to the storage periods, a total guarantee could be obtained only if the electrical consumption is in the vicinity of 100 microamperes-hour.

SUMMARY OF THE INVENTION

The present invention aims to satisfy this requirement and its main objective is therefore to provide a device for keeping a vehicle computer in a transport mode leading to an almost zero electrical consumption while this transport mode is implemented.

To this end, the aim of the invention is a device for keeping a computer of a motor vehicle comprising a microprocessor in a standby mode, called transport mode, and for switching over to an active mode, called customer mode, said device comprising at least one electrical switch connected in such a way that a change of initial state of said electrical switch constitutes the event triggering the switching over of the computer between its transport mode and its customer mode. According to the invention, and firstly, this keeping and switching device also comprises:

an electrical circuit incorporating each electrical switch and an electrical power supply provided with a terminal for connection to the battery of the vehicle and a control input linked to the microprocessor by a control line, said electrical power supply being designed to exhibit two states:

a power supply conducting steady state of each electrical switch in which it does not generate power consumption, obtained in the absence of a signal on its control input or upon the reception of a control signal Sc of logic level "0", and a blocked state in which it generates power consumption, obtained in the presence of a control signal Sc of logic level "1" on its control input, and a logic circuit designed to detect the change of initial state of each electrical switch and to deliver a signal activating the microprocessor upon this detection.

Furthermore, according to the invention, the microprocessor is programmed, after it has been activated, to deliver a binary control signal Sc suitable for generating cyclical switchovers of the electrical power supply between its conducting state and its blocked state.

According to the invention, each electrical switch is therefore powered, during the transport mode, by an electrical power supply that is in a steady conducting state (absence of signal on its control input), in which it does not generate power consumption.

The monitoring of the state of the electrical switches and the detection of the change of initial state of one of said electrical switches do not therefore require any activity on the part of the microprocessor, the activation of which is triggered only following this change of initial state, that is to say upon the switching over of the computer to its customer mode.

It should be noted that, according to this method, the power supply of the microprocessor during the transport mode is therefore not only not necessary, but, on the contrary, this absence of power supply guarantees that the electrical power supply is kept in a conducting state, because of the absence of control signal at the control input of said electrical power supply.

Such a keeping and switching device therefore makes it possible to optimally limit the consumption of the computer during the transport mode (consumption less than 100 microamperes-hour) and thus makes it possible to satisfy the conditions guaranteeing against the total discharging of the batteries.

In the customer mode, the microprocessor is, furthermore, programmed in such a way as to deliver a binary control signal making it possible to monitor the state of each electrical switch in the context of the application to which said electrical switches are dedicated (unlocking of the doors, action of the ignition key, etc.). Such a control signal makes it possible to replace the steady power supply with an alternating power supply designed notably to limit the current consumption in the assumption that a switch is blocked in an active state.

Based on this principle, one advantageous embodiment of the invention consists in producing the electrical circuit in such a way that each electrical switch is linked to the ground, and in configuring each of said electrical switches in such a way that it exhibits an open state in the transport mode, and that the event triggering the switching over of the computer consists in the closing of one of said electrical switches.

According to this embodiment, each electrical switch is therefore brought to a potential equal to the voltage of the current supplied by the electrical power supply (which is itself equal to the battery voltage) and a closing of an electrical switch causes this potential to be cancelled.

Thus, advantageously according to the invention, changing the state of an electrical switch simply entails producing a logic circuit designed to detect a variation of the voltage at the terminals of each electrical switch.

According to another advantageous embodiment of the invention, the electrical power supply comprises an electronic switch suitable for exhibiting a conducting state and a blocked state, and electronic means for controlling the switchovers of said electronic switch with a duty cycle that is a function of the form of the binary control signal.

Moreover, and advantageously according to the invention, the logic circuit comprises:

a first branch intended for the transport mode, for detecting a change of initial state of an electrical switch;

and a second branch linked to a logic input of the microprocessor, intended for the customer mode, and designed to detect the changes of state of the electrical switches and to deliver an information signal to said logic input of said microprocessor.

This logic circuit is therefore designed to manage, on the one hand, the switchover between the transport mode and the customer mode, and, on the other hand, the switchovers of the electrical switches that occur in said customer mode (unlocking of the doors, ignition switched, etc.).

BRIEF DESCRIPTION OF THE DRAWINGS

Other features, aims and advantages of the invention will emerge from the following detailed description with reference to the attached drawings which represent, by way of nonlimiting example, a preferential embodiment thereof. In these drawings.

DETAILED DESCRIPTION OF THE PREFERRED EMBODIMENTS

Figure 1:
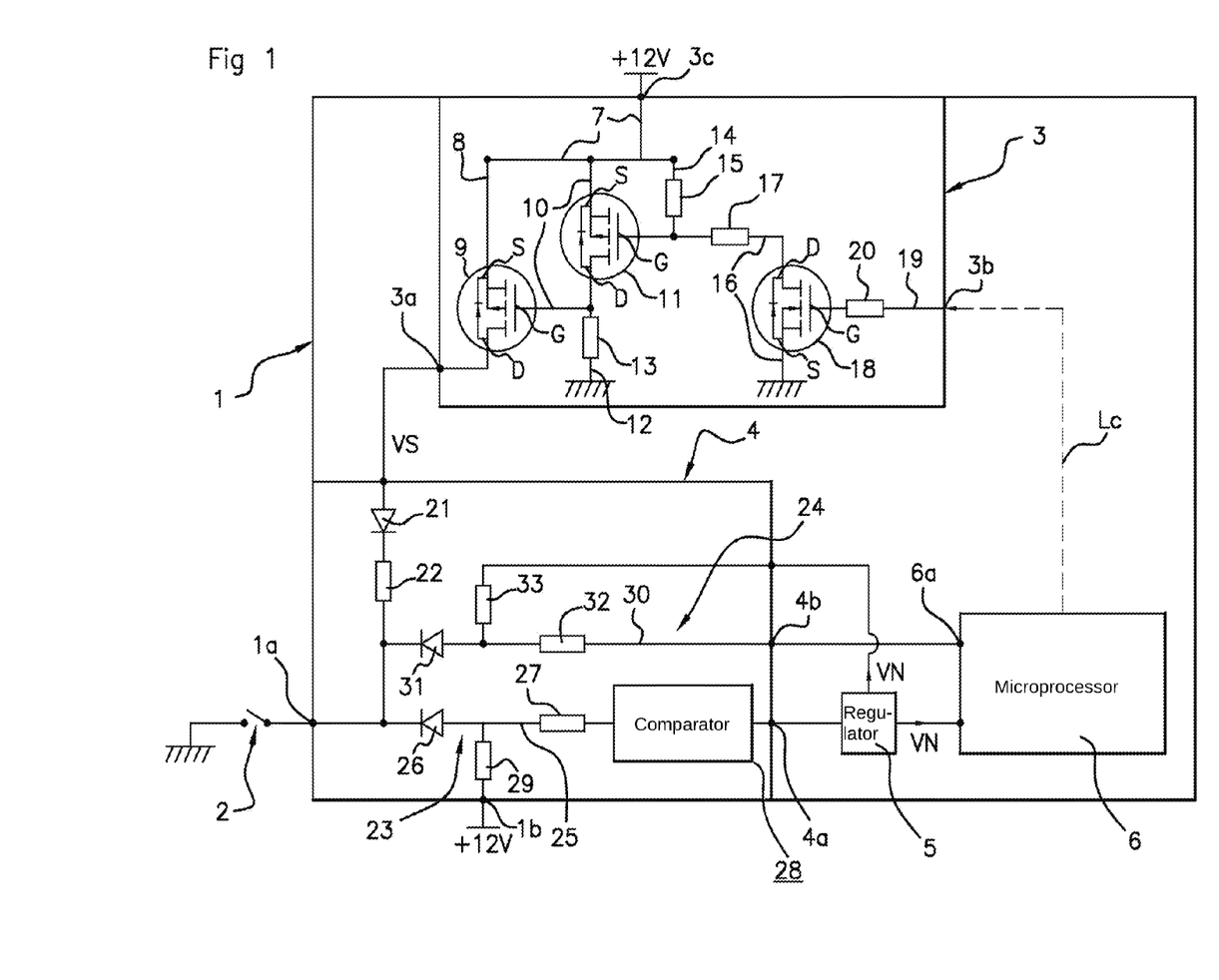
FIG. 1 is an overall electrical diagram of a keeping and switching device conforming to the invention.

The device schematically represented in FIG. 1 consists of a device for keeping a computer 1 of a motor vehicle incorporating a microprocessor 6 in a standby mode, called transport mode, and for switching over to an active mode, called customer mode, this device comprising, in addition to this computer 1, at least one electrical switch 2 linked to the ground and connected to a power supply output 1a of said computer, in such a way that a change of initial state of said electrical switch constitutes the event triggering the switchover between the transport mode and the customer mode.

Firstly, this device further comprises, incorporated in the computer 1:

an electrical power supply 3 provided with a power supply output 3a delivering a current of voltage VS, a terminal 3c for connecting to the 12 volt battery of the vehicle, and a control input 3b linked to the microprocessor 6 by a control line Lc, said electrical power supply being designed to exhibit two states:

a power supply conducting steady state of each electrical switch 2 in which it does not generate power consumption, obtained in the absence of a signal on its control input 3b or upon the reception of a control signal Sc of logic level "0", and a blocked state in which it generates power consumption, obtained in the presence of a control signal Sc of logic level "1" on its control input 3b, a logic circuit 4 to which each electrical switch 2 is connected (power supply output 1a), designed to detect the changes of state of each of said electrical switches 2 both in the transport mode and in the customer mode of the computer 1, and, upon this detection:

during the transport mode, to deliver, at a first logic output 4a, an activation signal intended for a regulator 5 designed, upon reception of this activation signal, to power the microprocessor 6 with a current of voltage VN usually equal to 5 volts, and thus "reactivate" said microprocessor, during the customer mode, to deliver, at a second logic output 4b, an information signal intended for a logic input 6a of the microprocessor 6.

Furthermore, the microprocessor 6 is programmed, in addition to its usual functions, to deliver, during the customer mode, to the control input 3b of the electrical power supply 3, a binary signal, consisting in the example of a 0 volt-5 volt signal, suitable for generating cyclical switchovers of said electrical power supply 3 between its conducting state and its blocked state.

Figure 5A:
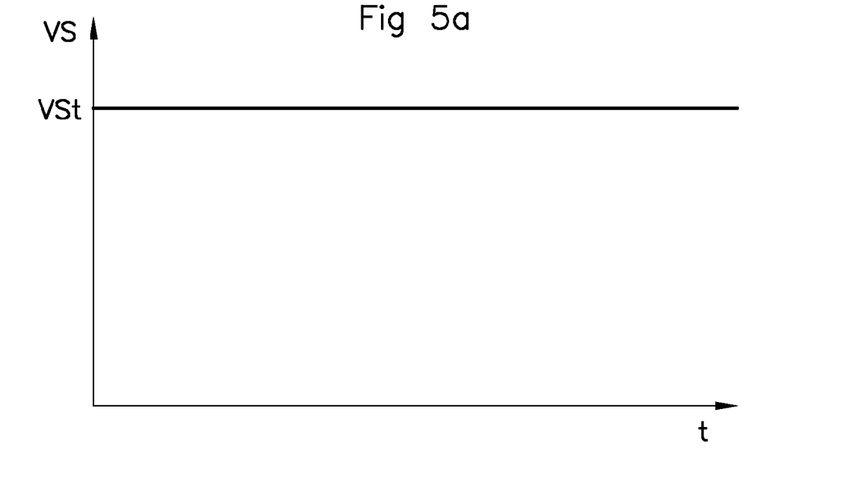
FIGS. 5a and 5b represent the voltage supplied by the electrical power supply, respectively in the transport mode (FIG. 5a) and in the customer mode (FIG. 5b) of the computer.

Thus, during the transport mode, the microprocessor 6 is switched off, and, because of this, no control signal arrives at the control input 3b of the electrical power supply 3: the latter is therefore configured, permanently, in a conducting state in which the current delivered at the power supply output 3a is a current of continuous voltage VSt represented in FIG. 5a.

Figure 5B:
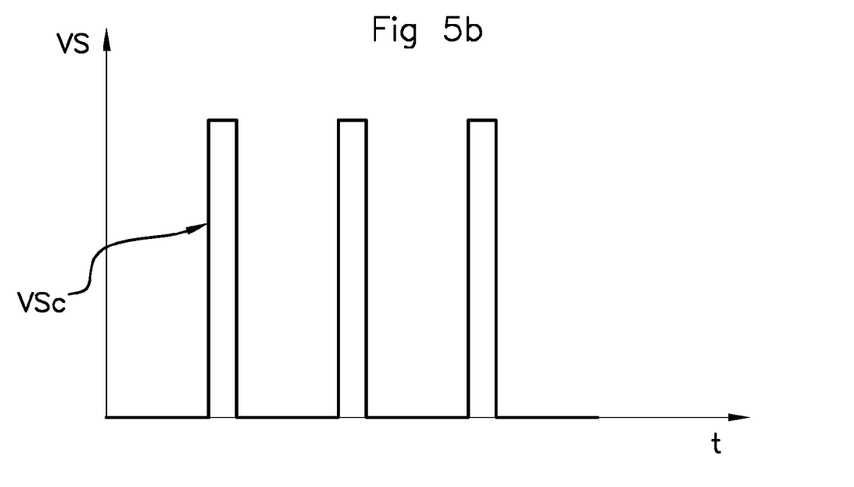

By contrast, during the customer mode, the electrical power supply 3 is configured alternately in a conducting state and in a blocked state, such that said electrical power supply behaves like a switched mode power supply delivering a current of voltage VSc, represented in FIG. 5b, the duty cycle of which is determined by the form of the binary control signal Sc.

To this end, this electrical power supply 3 mainly comprises:

an electronic switch consisting of a MOSFET transistor 9 suitable for exhibiting a conducting state and a blocked state, and electronic means for controlling the switchovers of this MOSFET transistor 9, connected to the control input 3b and comprising, mainly, two MOSFET transistors 11, 18, said electronic control means being designed to:

form an intermediate stage for transforming the voltage of the binary signal into a voltage of 12 volts, controlling, in the presence of a binary control signal Sc on the control input 3b, blockings of the conducting of the transistor 9 that are a function of the duty cycle of the control signal.

To give more detail, and firstly, the electrical power supply 3 comprises a main branch 7 linked to the terminal 3c, in the extension of which there extend:

a first branch 8 powering the source S of the transistor 9, the drain D of which is linked to the power supply output 3a, a second branch 10 powering the source S of the first control transistor 11, the drain D of which is linked, on the one hand, to the gate G of the transistor 9, and, on the other hand, to the ground via an ancillary line 12 comprising a resistor 13, and a third branch 14 to which is connected a resistor 15, linked, on the one hand, to the gate G of the first control transistor 11, and, on the other hand, to an ancillary branch 16, to which is connected a resistor 17, powering the drain D of the second control transistor 18, the source S of which is linked to the ground.

Finally, the gate G of the second control transistor 18 is linked to the control input 3b by a branch 19 on which a resistor 20 is inserted.

Such an electrical power supply 3 operates as follows:

in the absence of a signal or upon the reception of a control signal Sc of logic level "0" on the control input 3b, the two control transistors 11, 18 are blocked and the transistor 9 acting as electronic switch conducts: the electrical power supply 3 delivers a current of voltage Vst (FIG. 5a) and does not generate power consumption because of the absence of current diverted to the ground, upon the reception of a control signal Sc of logic level "1" on the control input 3b, the two control transistors 11, 18 conduct and the transistor 9 acting as electronic switch is blocked: the electrical power supply 3 is in a blocked state in which it generates power consumption because an electrical current is diverted to the ground.

The logic circuit 4 linked to the power supply output 3a of the electrical power supply 3 comprises, firstly, a main branch on which a non-return diode 21 and a resistor 22 are inserted, and that is split into two branches 23, 24.

The first of these branches 23, intended for the transport mode, and designed to detect a change of initial state of an electrical switch 2, comprises:

an electrical line 25 on which there are inserted, in succession, a non-return diode 26, a resistor 27 and a comparator 28 connected to a logic output 4a linked to the regulator 5, where a logic signal is delivered, and a pull-up resistor 29 linked to the 12 volt battery of the vehicle.

The second branch 24, intended for the customer mode and designed to detect the changes of state of the electrical switches 2, comprises:

an electrical line 30 on which there are inserted, in succession, a non-return diode 31 and a resistor 32, connected to a logic output 4b linked to the logic input 6a of the microprocessor 6, and a pull-up resistor 33 linked to the regulator 5.

The operation of this logic circuit 4 is described below.

Figure 2:
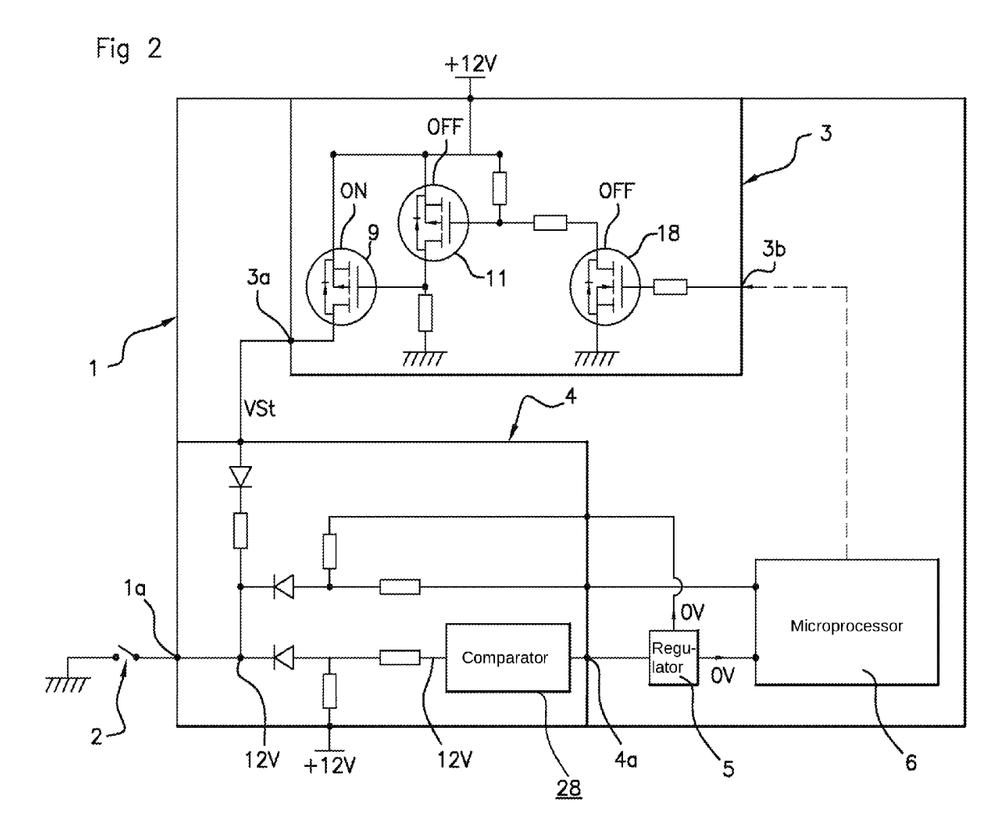
FIG. 2 represents this device in the transport mode of the computer.

In the transport mode represented in FIG. 2, the electrical power supply 3 is in its conducting state because of the absence of a signal on its control input 3b, and the switch 2 is open. This electrical switch 2 is therefore raised to a potential equal to the voltage Vst equal to 12 volts of the current supplied by the electrical power supply 3, and the comparator 28 therefore also receives a current of voltage equal to 12 volts and delivers a zero logic signal to the regulator 5: the microprocessor 6 therefore remains off.

Figure 3:
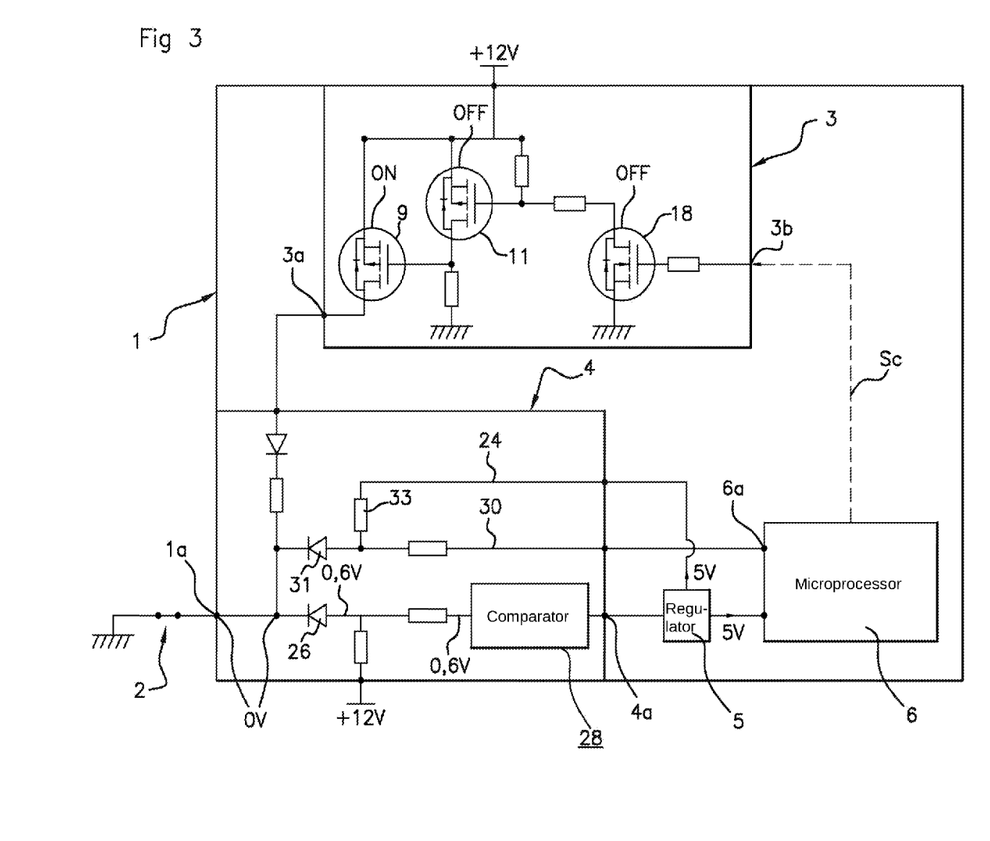
FIG. 3 represents this device upon the change of initial state of an electrical switch.

However, the initial closing of an electrical switch 2 leads to the voltage being cancelled at the power supply output 1a of the computer 1, and, as represented in FIG. 3, the comparator 28 therefore receives a current of voltage equal to the threshold voltage of the diode 26, generally of the order of 0.6 volt, and delivers a signal of logic level "1" to the regulator 5 and to the pull-up resistor 33 of the second branch 24 of the logic circuit 4. This regulator 5 then delivers a current of voltage VN usually equal to 5 volts, powering the microprocessor 6, causing the latter to be activated and the computer 1 to be switched over to its customer mode.

In this customer mode, the comparator 28 is deactivated on a command from the microprocessor 6, and the changes of state of each electrical switch 2 are detected by the second branch 24 of the logic circuit 4 linked to the logic input 6a of said microprocessor.

Figure 4:
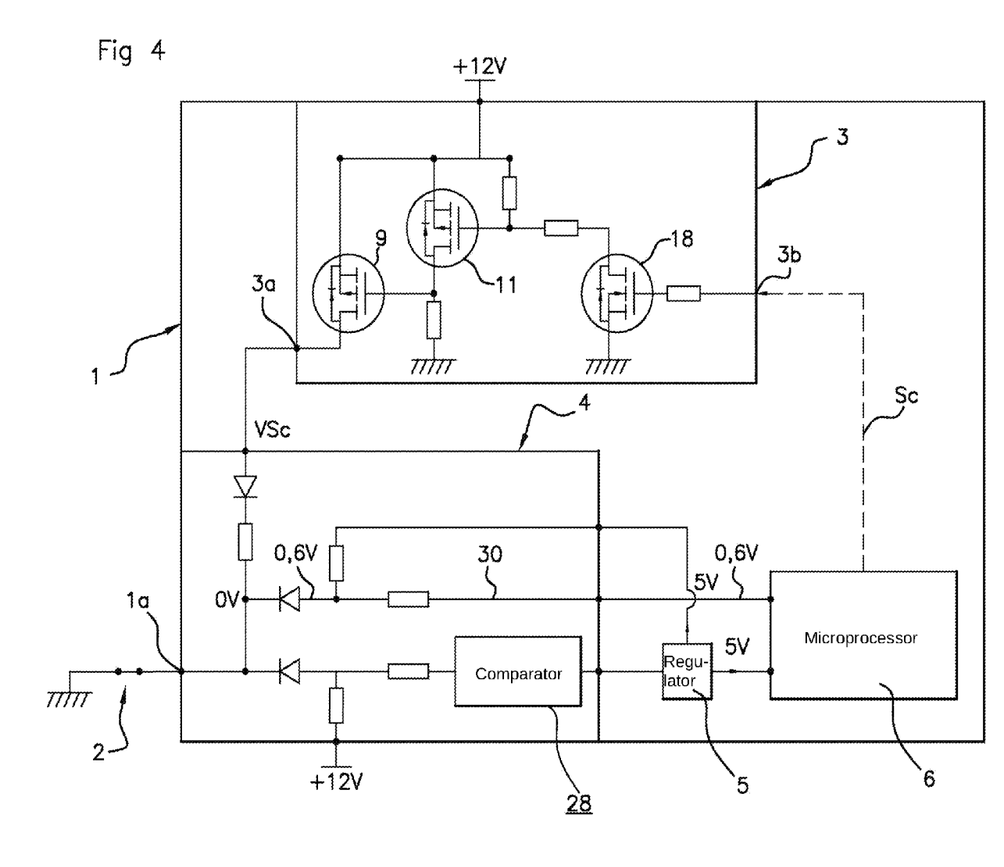
FIG. 4 represents this device in the customer mode of the computer.

In a manner similar to the operation of the first branch 23, the detection of this change of state results from a modification of the voltage of the current flowing in the electrical line 30, equal to 12 volts in the open state of the electrical switch 2, and, as represented in FIG. 4, equal to the threshold voltage of the diode 31 in the closed state of said electrical switch.

The invention thus leads, on the one hand, to the consumption of the computer being optimally limited during the transport mode (consumption less than 100 microamperes-hour), and, on the other hand, in the customer mode, to each electrical switch being powered alternately in the context of the application to which the latter is dedicated (unlocking of the doors, action of the ignition key, etc.), thus making it possible to limit the current consumption in the assumption that one of said electrical switches is blocked in an active state.

The invention claimed is:

1. A device for switching a computer (1) of a motor vehicle between a standby mode and an active mode said device comprising:
    a microprocessor (6);
    at least one electrical switch (2) connected in such a way that a change of an initial state of said electrical switch constitutes an event that triggers a switching of the computer (1) between the standby mode and the active mode;
    an electrical circuit (1a, 2, 3, 3a), incorporating each one of said at least one electrical switch (2), and an electrical power supply (3) provided with a terminal (3c) for connection to the battery of the vehicle, said electrical power supply configured to operate in either of a power supply conducting state of each one of said at least one electrical switch (2); and
    a logic circuit (4) configured to detect the change of the initial state of each electrical switch (2) and to deliver a signal activating the microprocessor (6) upon said detection,
    wherein:
    the electrical power supply is provided with a control input (3b), linked to the microprocessor (6) by a control line (Lc), the electrical power supply configured to operate in either of:
        a power supply conducting state, in which the microprocessor does not consume power, the electrical power supply configured to operate in said power supply conducting state if either of the following conditions are satisfied:
            i) an absence of a signal on the control input (3b), or
            ii) upon reception of a control signal (Sc) of logic level "0" at said control input (3b), and
        a blocked state in which the microprocessor activates and consumes power, the electrical power supply configured to operate in said blocked state when a control signal Sc of logic level "1" is present on the control input (3b), and
    the microprocessor (6) is programmed to, after activation of said microprocessor, deliver a control signal Sc, having a binary form, that generates cyclical switchovers of the electrical power supply (3) between said conducting state and said blocked state.

2. The keeping and switching device as claimed in claim 1, wherein the electrical circuit (1a, 2, 3, 3a) configured so that each one of said at least one electrical switch (2) is linked to ground, each one of said at least one electrical switch being configured to exhibit an open state in the standby mode, so that the event triggering the switching over of the computer (1) consists in a closing of the at least one electrical switch (2).

3. The keeping and switching device as claimed in claim 2, wherein the logic circuit (4) is configured to detect a variation of the voltage at the terminals of each one of said at least one electrical switch (2).

4. The keeping and switching device as claimed in claim 1, wherein the electrical power supply (3) comprises:
an electronic switch (9) configured to operate in either of the conducting state and the blocked state, and
electronic means (11, 18) that controls the switchovers of said electronic switch with a duty cycle that is a function of the binary form of the control signal Sc.

5. The keeping and switching device as claimed in claim 1 wherein the logic circuit (4) comprises:
a first branch (23) configured to detect, in the standby mode, a change of initial state of an electrical switch (2),
and a second branch (24), linked to a logic input (6a) of the microprocessor (6), configured to detect, in the active mode, the changes of state of the electrical switches (2) and further configured to deliver an information signal to the logic input of said microprocessor.

6. The keeping and switching device as claimed in claim 2, wherein the electrical power supply (3) comprises:
an electronic switch (9) configured to operate in either of the conducting state and the blocked state, and
electronic means (11, 18) that controls the switchovers of said electronic switch with a duty cycle that is a function of the binary form of the control signal Sc.

7. The keeping and switching device as claimed in claim 3, wherein the electrical power supply (3) comprises:
an electronic switch (9) configured to operate in either of the conducting state and the blocked state, and
electronic means (11, 18) that controls the switchovers of said electronic switch with a duty cycle that is a function of the binary form of the control signal Sc.

8. The keeping and switching device as claimed in claim 2, wherein the logic circuit (4) comprises:
a first branch (23) configured to detect, in the standby mode, a change of initial state of an electrical switch (2),
and a second branch (24), linked to a logic input (6a) of the microprocessor (6), configured to detect, in the active mode, the changes of state of the electrical switches (2) and further configured to deliver an information signal to the logic input of said microprocessor.

9. The keeping and switching device as claimed in claim 3, wherein the logic circuit (4) comprises:
a first branch (23) configured to detect, in the standby mode, a change of initial state of an electrical switch (2),
and a second branch (24), linked to a logic input (6a) of the microprocessor (6), configured to detect, in the active mode, the changes of state of the electrical switches (2) and further configured to deliver an information signal to the logic input of said microprocessor.

10. The keeping and switching device as claimed in claim 4, wherein the logic circuit (4) comprises:
a first branch (23) configured to detect, in the standby mode, a change of initial state of an electrical switch (2),
and a second branch (24), linked to a logic input (6a) of the microprocessor (6), configured to detect, in the active mode, the changes of state of the electrical switches (2) and further configured to deliver an information signal to the logic input of said microprocessor.

* * * * *